(12) United States Patent
Tang et al.

(10) Patent No.: US 11,227,769 B2
(45) Date of Patent: Jan. 18, 2022

(54) METHOD FOR FABRICATING SEMICONDUCTOR DEVICE

(71) Applicant: UNITED MICROELECTRONICS CORP., Hsin-Chu (TW)

(72) Inventors: Chun-Jung Tang, Tainan (TW); Yu-Jen Liu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 26 days.

(21) Appl. No.: 16/833,685

(22) Filed: Mar. 30, 2020

(65) Prior Publication Data

US 2021/0272813 A1 Sep. 2, 2021

(51) Int. Cl.
*H01L 21/28* (2006.01)
*H01L 29/66* (2006.01)
*H01L 29/49* (2006.01)

(52) U.S. Cl.
CPC .. *H01L 21/28176* (2013.01); *H01L 21/28079* (2013.01); *H01L 21/28088* (2013.01); *H01L 29/495* (2013.01); *H01L 29/4958* (2013.01); *H01L 29/6656* (2013.01); *H01L 29/66545* (2013.01); *H01L 29/66871* (2013.01)

(58) Field of Classification Search
CPC ......... H01L 29/66545; H01L 29/66871; H01L 29/6681; H01L 29/6656; H01L 29/495; H01L 29/66515; H01L 29/4958; H01L 29/4966; H01L 21/28079; H01L 21/28088; H01L 21/28176
See application file for complete search history.

(56) References Cited

U.S. PATENT DOCUMENTS 9,425,279 B1 * 8/2016 Ando ................. H01L 29/4966
2017/0077257 A1   3/2017 Hung et al.
2019/0103277 A1 * 4/2019 Luan .................... H01L 29/401

* cited by examiner

*Primary Examiner* — Jose R Diaz
(74) *Attorney, Agent, or Firm* — Winston Hsu

(57) ABSTRACT

A method for fabricating semiconductor device includes the steps of: forming a gate structure on a substrate; forming an interlayer dielectric (ILD) layer around the gate structure; performing a replacement metal gate (RMG) process to transform the gate structure into a metal gate; forming an inter-metal dielectric (IMD) layer on the metal gate; forming a metal interconnection in the IMD layer; and performing a high pressure anneal (HPA) process for improving work function variation of the metal gate.

8 Claims, 4 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly to a method of conducting a high pressure anneal (HPA) process after metal interconnective process for improving work function variation.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, issues such as device mismatch still arise even when two transistors in either NMOS and/or PMOS regions are disposed adjacent to each other and affect the performance of the device. Hence, how to resolve this issue has become an important task in this field.

SUMMARY OF THE INVENTION

According to an embodiment of the present invention, a method for fabricating semiconductor device includes the steps of: forming a gate structure on a substrate; forming an interlayer dielectric (ILD) layer around the gate structure; performing a replacement metal gate (RMG) process to transform the gate structure into a metal gate; forming an inter-metal dielectric (IMD) layer on the metal gate; forming a metal interconnection in the IMD layer; and performing a high pressure anneal (HPA) process for improving work function variation of the metal gate.

According to an embodiment of the present invention, the RMG process includes the steps of: removing the gate structure to form a recess; forming a high-k dielectric layer in the recess; forming a work function metal (WFM) layer on the high-k dielectric layer; forming a top barrier metal (TBM) layer on the WFM layer; and forming a low resistance metal layer on the TBM layer.

According to an embodiment of the present invention, the TBM layer includes a first TBM layer on the WFM layer and a second TBM layer on the first TBM layer.

According to an embodiment of the present invention, the first TBM layer includes titanium nitride (TiN).

According to an embodiment of the present invention, a thickness of the first TBM layer is less than 20 Angstroms.

According to an embodiment of the present invention, the second TBM layer includes titanium (Ti).

According to an embodiment of the present invention, the HPA process includes hydrogen gas.

According to an embodiment of the present invention, a temperature of the HPA process is between 360° C. to 440° C.

According to an embodiment of the present invention, a duration of the HPA process is between 1 minute to 60 minutes.

According to an embodiment of the present invention, a pressure of the HPA process is between 5-100 atm.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
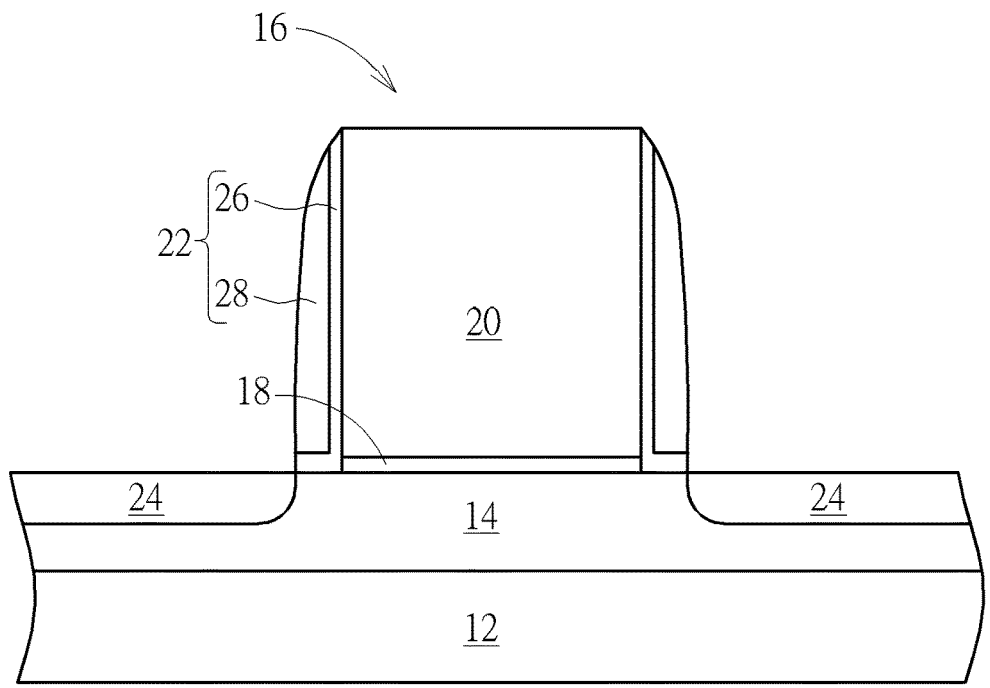
FIGS. 1-5 illustrate a method for fabricating semiconductor device according to an embodiment of the present invention.

Referring to FIGS. 1-5, FIGS. 1-5 illustrate a method for fabricating semiconductor device according to an embodiment of the present invention. As shown in FIG. 1, a substrate 12 is first provided, in which the substrate could be a silicon substrate or silicon-on-insulator (SOI) substrate. A transistor region, such as a PMOS region or a NMOS region could be defined on the substrate 12. At least a fin-shaped structure 14 and an insulating layer (not shown) are formed on the substrate 12, in which the bottom portion of the fin-shaped structure 14 is surrounded by the insulating later or shallow trench isolation (STI) preferably made of material such as silicon oxide. It should be noted that even though this embodiment pertains to the fabrication of a non-planar FET device such as FinFET device, it would also be desirable to apply the content of the following process to a planar FET device, which is also within the scope of the present invention.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, at least a gate structures 16 or dummy gate is formed on the substrate 12. In this embodiment, the formation of the gate structure 16 could be accomplished by a gate first process, a high-k first approach from gate last process, or a high-k last approach from gate last process. Since this embodiment pertains to a high-k last approach, a gate dielectric layer or interfacial layer, a gate material layer, and a selective hard mask could be formed sequentially on the substrate 12, and a pattern transfer process is then conducted by using a patterned resist (not shown) as mask to remove part of the gate material layer and part of the gate dielectric layer through single or multiple etching processes. After stripping the patterned resist, a gate structure 16 composed of patterned gate dielectric layer 18 and patterned material layer 20 are formed on the substrate 12.

Next, at least a spacer 22 is formed on the sidewalls of the gate structure 16, a source/drain region 24 and/or epitaxial layer (not shown) is formed in the substrate 12 adjacent to two sides of the spacer 22, and a selective silicide layer (not shown) could be formed on the surface of the source/drain region 24. In this embodiment, the spacer 22 could be a single spacer or a composite spacer, such as a spacer including but not limited to for example an offset spacer 26 and a main spacer 28. Preferably, the offset spacer 26 and the main spacer 28 could include same material or different material while both the offset spacer 26 and the main spacer 28 could be made of material including but not limited to for example $SiO_2$, SiN, SiON, SiCN, or combination thereof. The source/drain region 24 could include n-type dopants or p-type dopants depending on the type of device being fabricated.

Figure 2:
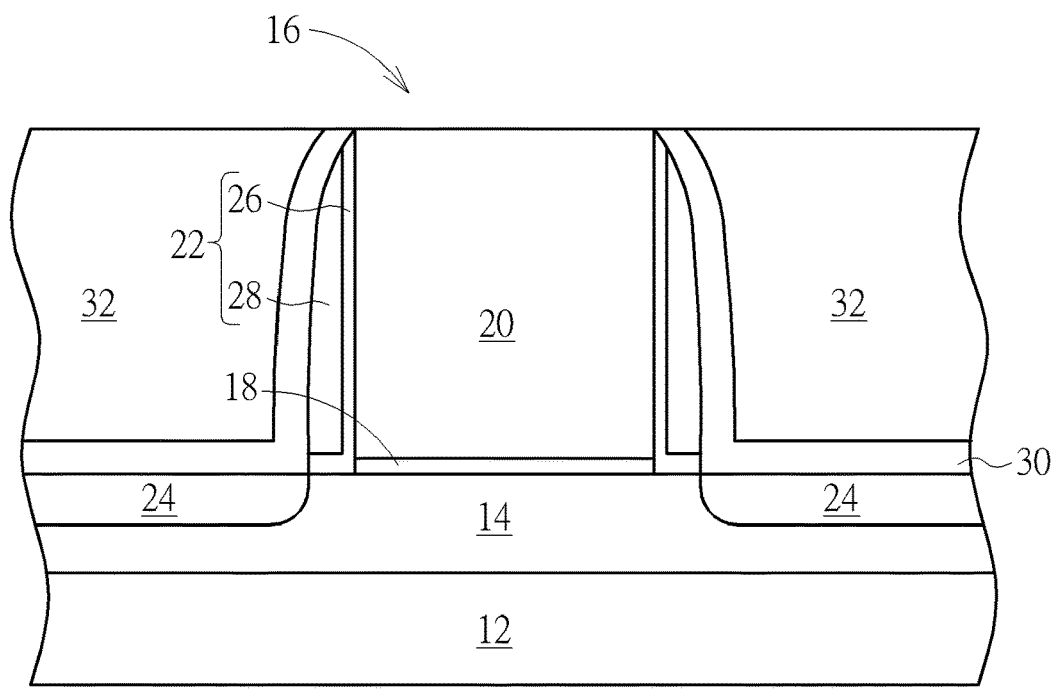

Next, as shown in FIG. 2, a contact etch stop layer (CESL) 30 is formed on the substrate 12 surface and the gate structure 16, and an interlayer dielectric (ILD) layer 32 is formed on the CESL 30 afterwards. Next, a planarizing process such as a chemical mechanical polishing (CMP) process is conducted to remove part of the ILD layer 32 and part of the CESL 30 to expose the gate material layer 20 composed of polysilicon so that the top surfaces of the gate material layer 20 and ILD layer 32 are coplanar.

Figure 3:
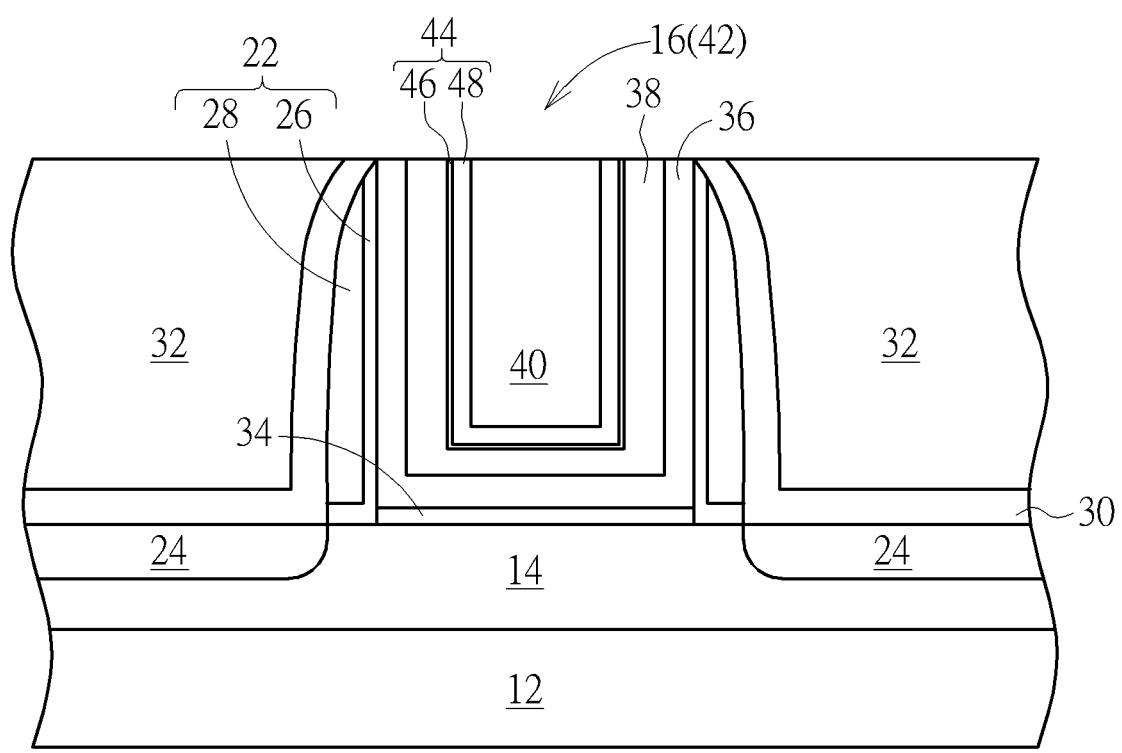

Next, as shown in FIG. 3, a replacement metal gate (RMG) process is conducted to transform the gate structure 16 into a metal gate. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 20 or even gate dielectric layer 18 from gate structure 16 for forming a recess (not shown) in the ILD layer 32. Next, a selective interfacial layer 34 or gate dielectric layer (not shown), a high-k dielectric layer 36, a work function metal layer 38, a barrier layer 44, and a low resistance metal layer 40 are formed in the recesses, and a planarizing process such as CMP is conducted to remove part of low resistance metal layer 40, part of the barrier layer 44, part of work function metal layer 38, and part of high-k dielectric layer 36 to form a metal gate 42. In this embodiment, the gate structure or metal gate 42 fabricated through high-k last process of a gate last process preferably includes an interfacial layer 34 or gate dielectric layer (not shown), a U-shaped high-k dielectric layer 36, a U-shaped work function metal layer 38, a U-shaped barrier layer 44, and a low resistance metal layer 40.

In this embodiment, the high-k dielectric layer 36 is preferably selected from dielectric materials having dielectric constant (k value) larger than 4. For instance, the high-k dielectric layer 36 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 38 is formed for tuning the work function of the metal gate in accordance with the conductivity of the device. For an NMOS transistor, the work function metal layer 38 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 38 having a work function ranging between 4.8 eV and 5.2 eV may include titanium nitride (TiN), tantalum nitride (TaN), tantalum carbide (TaC), but it is not limited thereto. The barrier layer 44 formed between the work function metal layer 38 and the low resistance metal layer 40 may include titanium (Ti), titanium nitride (TiN), tantalum (Ta) or tantalum nitride (TaN). Furthermore, the material of the low-resistance metal layer 40 may include copper (Cu), aluminum (Al), titanium aluminum (TiAl), cobalt tungsten phosphide (CoWP) or any combination thereof.

In this embodiment, the barrier layer 44 further includes a first barrier layer 46 and a second barrier layer 48, in which the first barrier layer 46 preferably includes TiN and the second barrier layer 48 preferably includes Ti. Preferably, the thickness of the first barrier layer 46 is less than the thickness of the second barrier layer 48, in which the first barrier layer 46 is preferably less than 20 Angstroms while the second barrier layer 48 is preferably between 80 Angstroms to 100 Angstroms or most preferably at 90 Angstroms.

Figure 4:
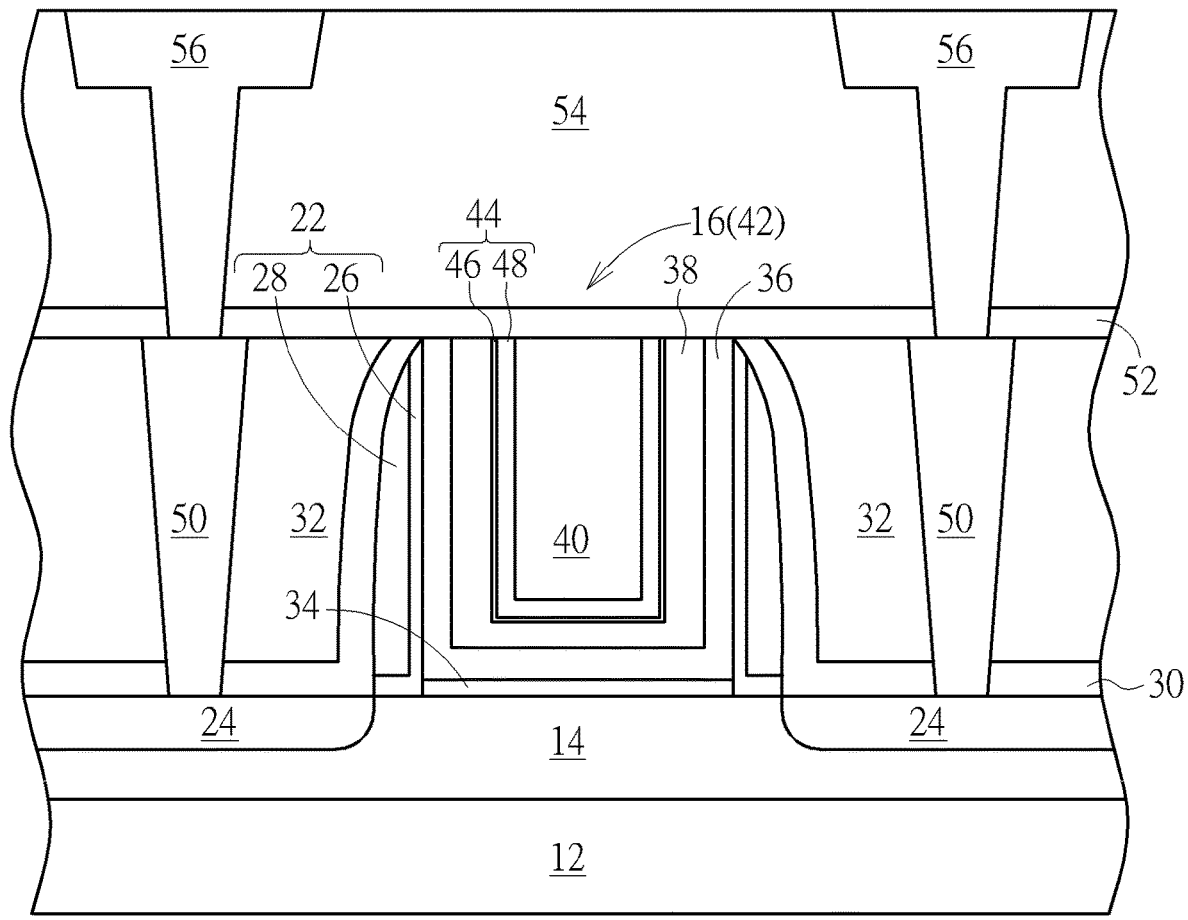

Next, as shown in FIG. 4, a photo-etching process is conducted by using a patterned mask (not shown) as mask to remove part of the ILD layer 32 and part of the CESL 30 adjacent to the metal gate 42 for forming contact holes (not shown) exposing the source/drain region 24 underneath. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs 50 electrically connecting the source/drain region 24.

Next, a metal interconnective process could be carried out by forming a stop layer 52 and an inter-metal dielectric (IMD) layer 54 are formed on the surface of the ILD layer 32, and one or more photo-etching process is conducted to remove part of the IMD layer 54 and part of the stop layer 52 to form contact holes (not shown). Next, conductive materials are deposited into each of the contact holes and a planarizing process such as CMP is conducted to form metal interconnections 56 directly connecting the contact plugs 50 underneath. Next, back-end-of-the-line (BEOL) process could be conducted by repeating the aforementioned steps for forming multiple metal interconnect structures made of IMD layers and metal interconnections therein on the ILD layer 32.

In this embodiment, the stop layer 52 could include nitrogen doped carbide (NDC), silicon nitride, silicon carbon nitride (SiCN), or combination thereof and each of the metal interconnections 56 could be formed in the IMD layer 54 through a single damascene or dual damascene process. For instance, each of the metal interconnections 56 could further include a barrier layer and a metal layer, in which the barrier layer could be selected from the group consisting of Ti, TiN, Ta, and TaN and the metal layer could be selected from the group consisting of W, Cu, Al, TiAl, and CoWP. Since single damascene process and dual damascene process are well known to those skilled in the art, the details of which are not explained herein for the sake of brevity.

Figure 5:
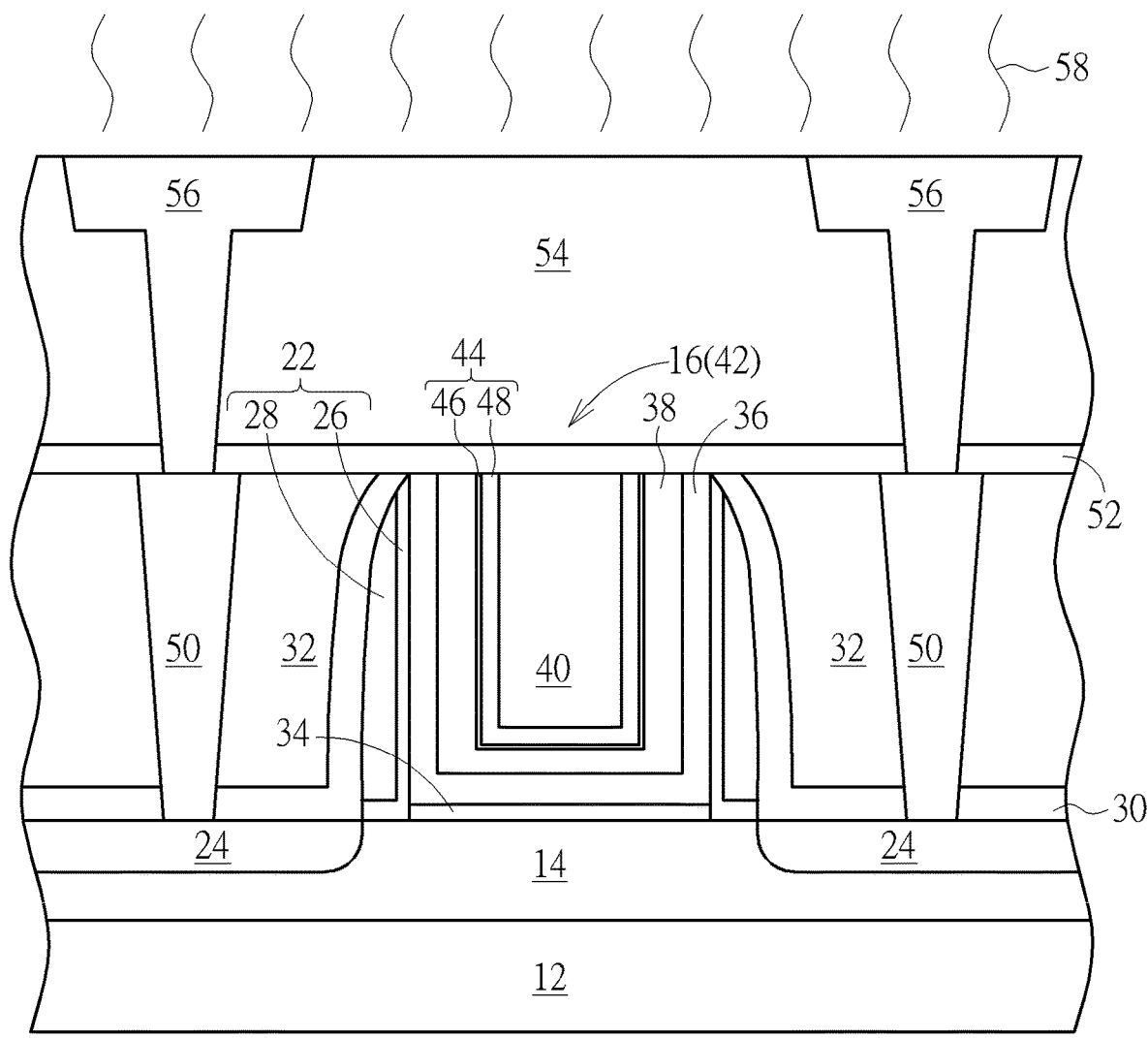

Next, as shown in FIG. 5, a high pressure anneal (HPA) process 58 is conducted to improve the work function variation of the metal gate 42. In this embodiment, the HPA process 58 preferably includes hydrogen gas ($H_2$), the temperature of the HPA process 58 is between 360° C. to 440° C. or most preferably 400° C., the duration of the HPA process 58 is between 1 minute to 60 minutes or most preferably 30 minutes, and the pressure of the HPA process 58 is between 5-100 atm or most preferably 20 atm.

In general, issues such as device mismatch often arise even when two transistors are disposed adjacent to each other on the NMOS and/or PMOS regions and such instance typically induces mismatch of threshold voltage (Vt), on-current ($I_{on}$), or saturation current between two adjacent devices. Since this issue may be caused by uneven thickness of work function metal layers formed during the RMG process or other variations, the present invention preferably lowers the thickness of the barrier layer such as the aforementioned first barrier layer 46 between work function metal layer 38 and low resistance metal layer 40 to less than 20 Angstroms or even close to 0 Angstroms so that work function variation could be minimized.

Moreover, another approach of the present invention includes conducting a high pressure anneal (HPA) process after the BEOL or metal interconnect process, in which the HPA process could be accomplished by injecting hydrogen gas ($H_2$) without the presence of other reacting gases such as nitrogen gas ($N_2$) while adjusting other fabrication parameters of the process such as maintaining the temperature of the HPA process between 360° C. to 440° C. or most preferably 400° C., the duration of the HPA process between 1 minute to 60 minutes or most preferably 30 minutes, and the pressure of the HPA process between 5-100 atm or most preferably 20 atm. By adjusting aforementioned parameters of the HPA process while selectively adjusting the thickness of the barrier layer, it would be desirable to effectively resolve the issue of device mismatch during fabrication of metal gate transistors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a gate structure on a substrate;
   forming an interlayer dielectric (ILD) layer around the gate structure;
   performing a replacement metal gate (RMG) process to transform the gate structure into a metal gate, wherein the RMG process comprises:
   removing the gate structure to form a recess;
   forming a high-k dielectric layer in the recess;
   forming a work function metal (WFM) layer on the high-k dielectric layer;
   forming a barrier layer on the WFM layer, wherein the barrier layer comprises:
   a first barrier layer on the WFM layer; and
   a second barrier layer on the first barrier layer, wherein a thickness of the first barrier layer is less than a thickness of the second barrier layer; and
   forming a low resistance metal layer on the barrier layer;
   forming an inter-metal dielectric (IMD) layer on the metal gate;
   forming a metal interconnection in the IMD layer; and
   performing a high pressure anneal (HPA) process for improving work function variation of the metal gate.

2. The method of claim 1, wherein the first barrier layer comprises titanium nitride (TiN).

3. The method of claim 2, wherein a thickness of the first barrier layer is less than 20 Angstroms.

4. The method of claim 1, wherein the second barrier layer comprises titanium (Ti).

5. The method of claim 1, wherein the HPA process comprises hydrogen gas.

6. The method of claim 1, wherein a temperature of the HPA process is between 360° C. to 440° C.

7. The method of claim 1, wherein a duration of the HPA process is between 1 minute to 60 minutes.

8. The method of claim 1, wherein a pressure of the HPA process is between 5-100 atm.

* * * * *

UNITED STATES PATENT AND TRADEMARK OFFICE
CERTIFICATE OF CORRECTION

PATENT NO. : 11,227,769 B2  
APPLICATION NO. : 16/833685  
DATED : January 18, 2022  
INVENTOR(S) : Chun-Jung Tang et al.

Page 1 of 1

It is certified that error appears in the above-identified patent and that said Letters Patent is hereby corrected as shown below:

On the Title Page

Item [30] insert:  
--Mar. 2, 2020 (TW) ...................... 109106796--.

Signed and Sealed this  
Twenty-second Day of March, 2022

Drew Hirshfeld  
*Performing the Functions and Duties of the*  
*Under Secretary of Commerce for Intellectual Property and*  
*Director of the United States Patent and Trademark Office*